(12) United States Patent
Ryan

(10) Patent No.: US 7,582,828 B2
(45) Date of Patent: Sep. 1, 2009

(54) MAGNETIC MOUNT FOR AN ELECTRONIC DEVICE

(75) Inventor: Todd Ryan, Riverside, CA (US)

(73) Assignee: Dana Innovations, San Clemente, CA (US)

( * ) Notice: Subject to any disclaimer, the term of this patent is extended or adjusted under 35 U.S.C. 154(b) by 0 days.

(21) Appl. No.: 11/936,946

(22) Filed: Nov. 8, 2007

(65) Prior Publication Data

US 2008/0110672 A1   May 15, 2008

(51) Int. Cl.
*H02G 3/08* (2006.01)
*H05K 7/14* (2006.01)

(52) U.S. Cl. .................. 174/50; 174/542; 174/481; 174/535; 220/3.2; 220/3.3; 220/4.02; 248/906

(58) Field of Classification Search ............ 174/480, 174/481, 50, 53, 57, 58, 17 R, 503, 520, 535, 174/559, 562, 61, 63, 135, 542; 220/3.2–3.9, 220/4.02; 248/906, 343, 205.3, 309.4, 205.2; 439/535–539, 39, 909, 38, 40, 923
See application file for complete search history.

(56) References Cited

U.S. PATENT DOCUMENTS

| | | | |
|---|---|---|---|
| 3,598,900 A * | 8/1971 | Drake ...................... 174/66 |
| 3,786,391 A * | 1/1974 | Mathauser .................. 439/39 |
| 3,808,577 A * | 4/1974 | Mathauser .................. 439/39 |
| 3,848,097 A | 11/1974 | Tucker | |
| 5,480,319 A * | 1/1996 | Vlakancic .................. 439/923 |
| 5,708,874 A * | 1/1998 | Schrock et al. ............ 248/309.4 |
| 5,721,394 A * | 2/1998 | Mulks ........................ 174/58 |
| 5,730,409 A | 3/1998 | Baron et al. | |
| 5,903,869 A * | 5/1999 | Jacobson et al. .......... 248/205.3 |
| 6,565,363 B2 * | 5/2003 | Downing .................... 439/39 |
| 7,155,027 B2 | 12/2006 | Lee | |
| 7,229,307 B2 * | 6/2007 | Ehr et al. .................. 439/909 |
| 7,273,983 B1 * | 9/2007 | Rintz .......................... 174/66 |
| 2002/0086559 A1 | 7/2002 | Dalmau Ferrerfabrega et al. | |
| 2006/0086873 A1 | 4/2006 | Chen | |

FOREIGN PATENT DOCUMENTS

WO   WO 2007/003035   1/2007

\* cited by examiner

*Primary Examiner*—Angel R Estrada
(74) *Attorney, Agent, or Firm*—Fish & Associates, PC

(57) ABSTRACT

The present invention provides a system and method for mounting an electrical device on a wall. The electrical device has a mount and a base. The base connects to an electrical outlet on a surface, and has a first electrical connector, and a magnetic face plate. The electrical device has a magnet and a second electrical conductor that are positioned so that the magnet mates with the magnetic face plate, and the second electrical connector mates with the first electrical connector.

13 Claims, 3 Drawing Sheets

MAGNETIC MOUNT FOR AN ELECTRONIC DEVICE

FIELD OF THE INVENTION

The field of the invention is surface mounting devices.

BACKGROUND OF THE INVENTION

It is known to mount electronic devices on walls, ceilings, bookcases, entertainment systems, stadium walkways, automobile trunks, and all manner of other surfaces. Mounting systems are usually semi-permanent, using screws, nails, and so forth.

Semi-permanent installations, however, can create numerous difficulties. Often, the electrical connection box is installed in a crooked manner, and the mounting system fails to allow sufficient leeway for correction. Removal and reinstallation of the connection box to correct the alignment can be extremely time consuming. Even properly installed devices can pose problems if the device needs to be removed for repair, replacement, cleaning, or other purposes.

One solution to resolving crooked installations is to employ a rotatable coupling between the mounted device and the connection box. For example, U.S. Pat. No. 7,155,027 to Lee (September 2006) teaches a speaker mounting system in which the speaker mount is adjusted for speaker placement by rotation around an anchor screw. U.S. Pat. No. 5,730,409 to Baron et al. (March 1998) teaches a mounting system in which a speaker is rotated upon a mounting bracket. These and all other extrinsic materials discussed herein are incorporated by reference in their entirety. Where a definition or use of a term in an incorporated reference is inconsistent or contrary to the definition of that term provided herein, the definition of that term provided herein applies and the definition of that term in the reference does not apply.

There are magnetic mounting systems that overcome the problems associated with semi-permanent mounts, but they don't allow the mount to rotate, at least not in the plane of the wall, ceiling or other structure upon which the mount is being mounted. U.S. Pat. No. 3,848,097 to Tucker (November 1974), for example, teaches a telephone mounting system in which magnets on the mount engage a striker plate of the outlet for convenient installation and removal of the mount to/from the outlet.

Still further the known magnetic mounting systems and the rotatable coupling systems have no automatic coupling of the electrical connectors. Thus, what is still needed in the art is a mounting system in which the mount is magnetically coupled to the base, and at least one pair of electrical connectors automatically mate as the mount is mounted upon the base.

SUMMARY OF THE INVENTION

The present invention provides apparatuses, systems and methods in which a mounting system includes a mount magnetically coupled to the base, and having at least one pair of electrical connectors that mate when the base is mounted upon the outlet box.

Although the base can be connected to a wall, ceiling, bookcase, entertainment system, stadium walkway, automobile trunk or other structure in any suitable manner, the base is preferably coupled to an outlet box using screws. The base preferably has a substantially planar surface, at least some portion of which includes a magnetically attractable material. To provide sufficient area for magnetic attraction, the planar surface preferably has a surface area of at least 25 cm$^2$.

The magnetic mounting can include any suitable number of magnets, placed on the mount, the base or both, in any suitable size, configuration and so forth. In preferred embodiments at least three magnets are glued into magnet seats circumferentially disposed about a center of the mount, on the surface facing the base.

Preferred embodiments also have a mechanism that allows the mount to rotate relative to the base. That feature is especially useful when the mount is rectangular, oval, or in some other way is not rotatably symmetrical.

All suitable mounts are contemplated, including especially mounts that comprise a speaker, a light, a control box, semiconductor display, or other electrical apparatus.

Banana plug and jack electrical connectors are especially preferred because they provide a convenient and robust way of making and breaking the electrical connections when fitting the mount to the base. In such instances the male plug can be advantageously carried on the mount.

Various objects, features, aspects and advantages of the inventive subject matter will become more apparent from the following detailed description of preferred embodiments, along with the accompanying drawings in which like numerals represent like components.

DETAILED DESCRIPTION

Figure 1:
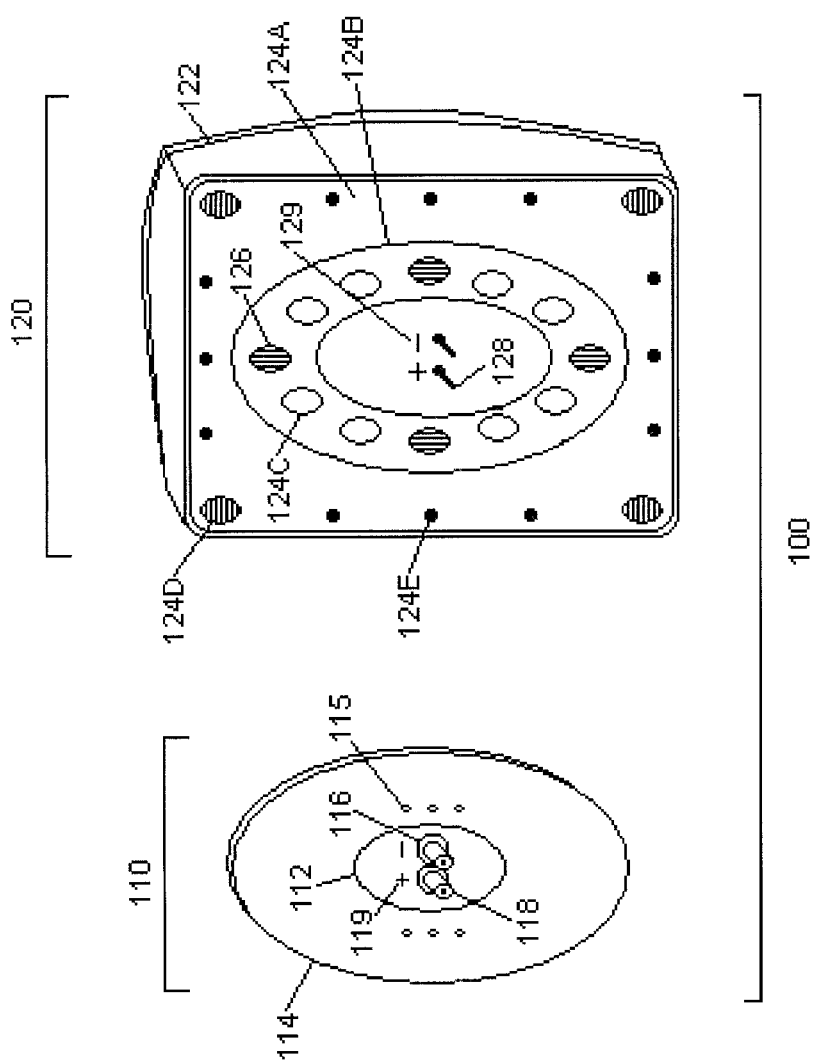
FIG. 1 is an exploded view of a mount, base, and outlet.

In FIG. 1 a mounting system 100 generally includes a base 110 and a mount 120.

Base 110 generally comprises two flat pieces, an inner piece 112 that is rotatably coupled to an outer piece 114. Two female electrical connectors 118A, 118B are attached to the inner piece 112 with bolts 116 and are labeled with polarity indicators 119. Base through holes 115 are used to attach the base to an outlet box (not shown).

Inner piece 112 preferably comprises steel because it provides a high degree of durability when rotated against the outer piece 114. Inner piece 112 need not be especially strong because it is not weight supporting, and can an alternatively be constructed of hard plastic or another other suitable material. Although not shown in the figures, inner piece 112 is preferably constructed of opposing members that are screwed together about a circumferential lip (not shown) extending inwardly from the outer piece 114. In FIG. 1 the inner piece 112 is about 6.5 cm in diameter, and about 3 mm in thickness. In other contemplated embodiments the inner piece can be larger or smaller, and can have any other suitable dimensions.

Outer piece 114 needs to be relatively strong because it supports the weight of the mount 120. Steel is again currently preferred, not only for its strength but also because it is magnetically attractable. It is contemplated that plastic or non-ferrous metals could be used instead of steel, but in that case outer piece 114 should include ferrous or other magnetic contact areas that match magnets 126.

Outer piece 114 also contains base through holes 115 for coupling with an electrical outlet box. In FIG. 1, six base through holes 115 are positioned to couple with a standard outlet box popular in the USA, but all other orientations, numbers and positions of base through holes 115 that would couple to alternative outlet boxes are also contemplated.

In FIG. 1 outer piece 114 is approximately 18.5 cm in diameter, and again about 3 mm in thickness. In other contemplated embodiments outer piece 114 can be larger or smaller, and can have any other suitable dimensions. The major surface of outer piece 114 is preferably substantially flat so that magnets 126 of mount 120 can properly attach to any point on the major surface of outer piece 114.

In FIG. 1 the female electrical connectors 118A,B are female banana jacks, held to the inner piece 112 by nuts 116. Banana couplings are preferred because they provide a particularly robust connection, and it is relatively easy to orient the plug to the jack. Of course, one could use a single plug and jack provided that a proper electrical pathway is established, for example, an RF connector. All other suitable types of connectors are also contemplated, including for example inductive connections (not shown), simple bent wire or other bump connectors (not shown), loudspeaker connectors (not shown), D-sub connectors (not shown), and combinations thereof. In this embodiment, where there are separate connectors for positive (+) and negative (−) polarities, one can optionally include polarity designators 119.

Mount 120 generally comprises a box structure 122 that may contain any electrical/electronic device, for example a speaker, lighting, display, or control panel. Mount 120 also includes a mounting surface 124, magnets 126, male electrical connectors 128A,B, and polarity designators 129.

Box structure 122 can be any suitable size or shape as appropriate to the electrical/electronic device(s) being operated therein. In FIG. 1 box 122 is approximately square with a side of 31 cm on its mounting surface 124, and slopes in two dimensions from a height of about 2 cm at the corners, to 6 cm at the midpoint of the sides, to about 7 cm at the apex (all figures including the grill). Box 122 is preferably made of hard plastic, although metal, wood and other materials are also contemplated. It is preferred that the materials used would be durable, scratch resistant, and capable of including or being colored or patterned.

Mounting surface 124 preferably has a flat area 124A that would abut a wall, ceiling or other surface upon which the mount is being placed, and a depression 124B sized and dimensioned to receive the base 110. The depression 124B includes a plurality of magnet seats 124C (in this case 12 such seats), some of which hold magnets 126. The precise number, size, and orientation of the magnet seats 124C and magnets 126 are largely a design choice, informed by the amount of weight to be held, and the distribution of weight of mount 120.

Mounting surface also has feet 124D to cushion the mount 120 when coupled against the base 110, and a plurality of mount through holes 124E that provide access to screws that couple the mounting surface 124 to the mount 122.

The male electrical connectors 128A,B are banana plugs, which are sized, spaced, and oriented to mate with the female electrical connectors 118A,B, respectively, as the mount 120 is being mounted on the base 110. In this embodiment, where there are separate connectors for positive (+) and negative (−) polarities, one can optionally include polarity designators 129.

Regardless of the type of connectors and manner of providing the electrical connections, it is preferred that the electrical connection is a substantially automatic. As the mount is mounted on the base, the female electrical connectors 119A,B should mate with the male electrical connectors 128A,B without a separate act. In FIG. 1, as mount 120 is placed near base 110, the magnetic force of magnets 126 upon outer surface 114 pull male electrical connectors 128A,B into female electrical connectors 119A,B. Forcing the user to manually mate the connectors in a separate act, whether with a Wire-Nut™ or otherwise, is thought to be much less preferable.

Figure 2:
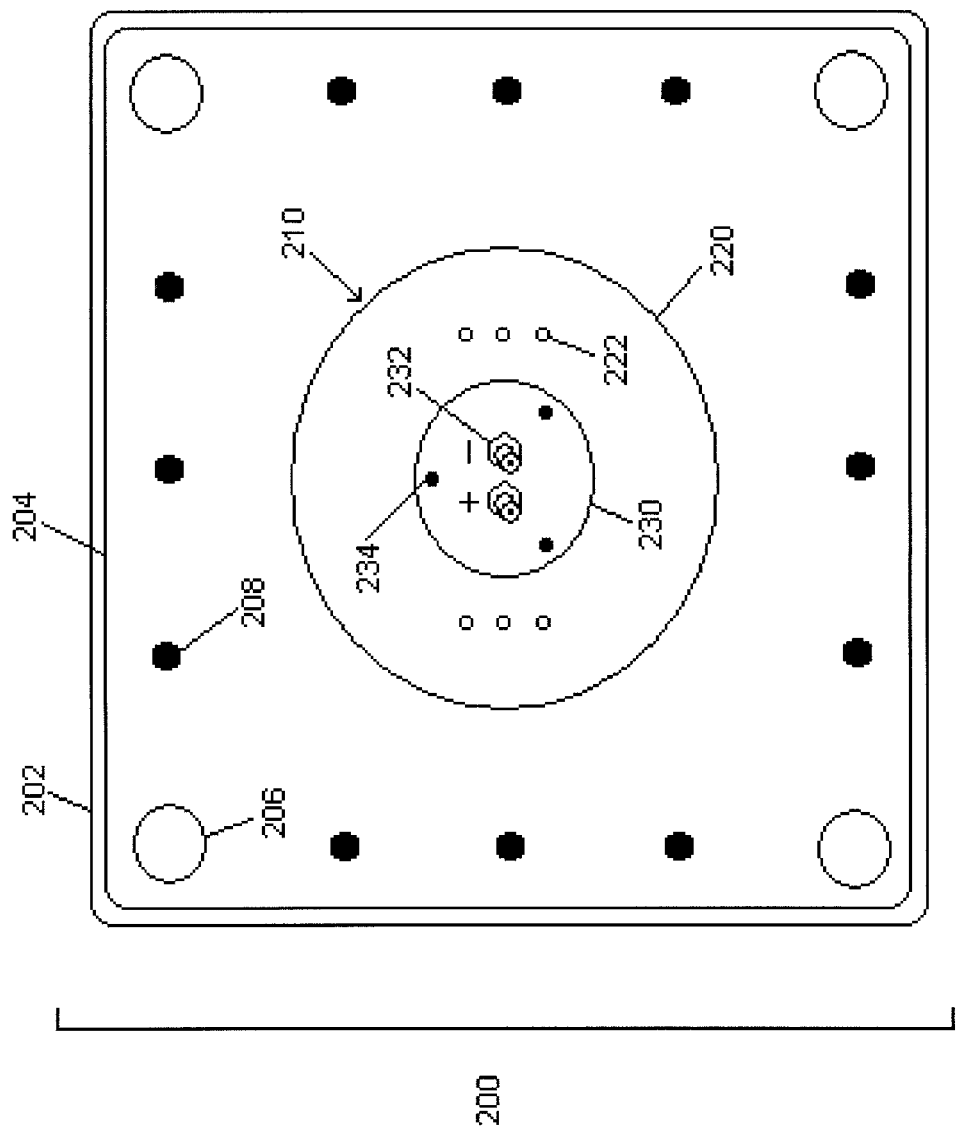
FIG. 2 is a rear perspective view of the mount and base of FIG. 1, coupled together.
Figure 3:
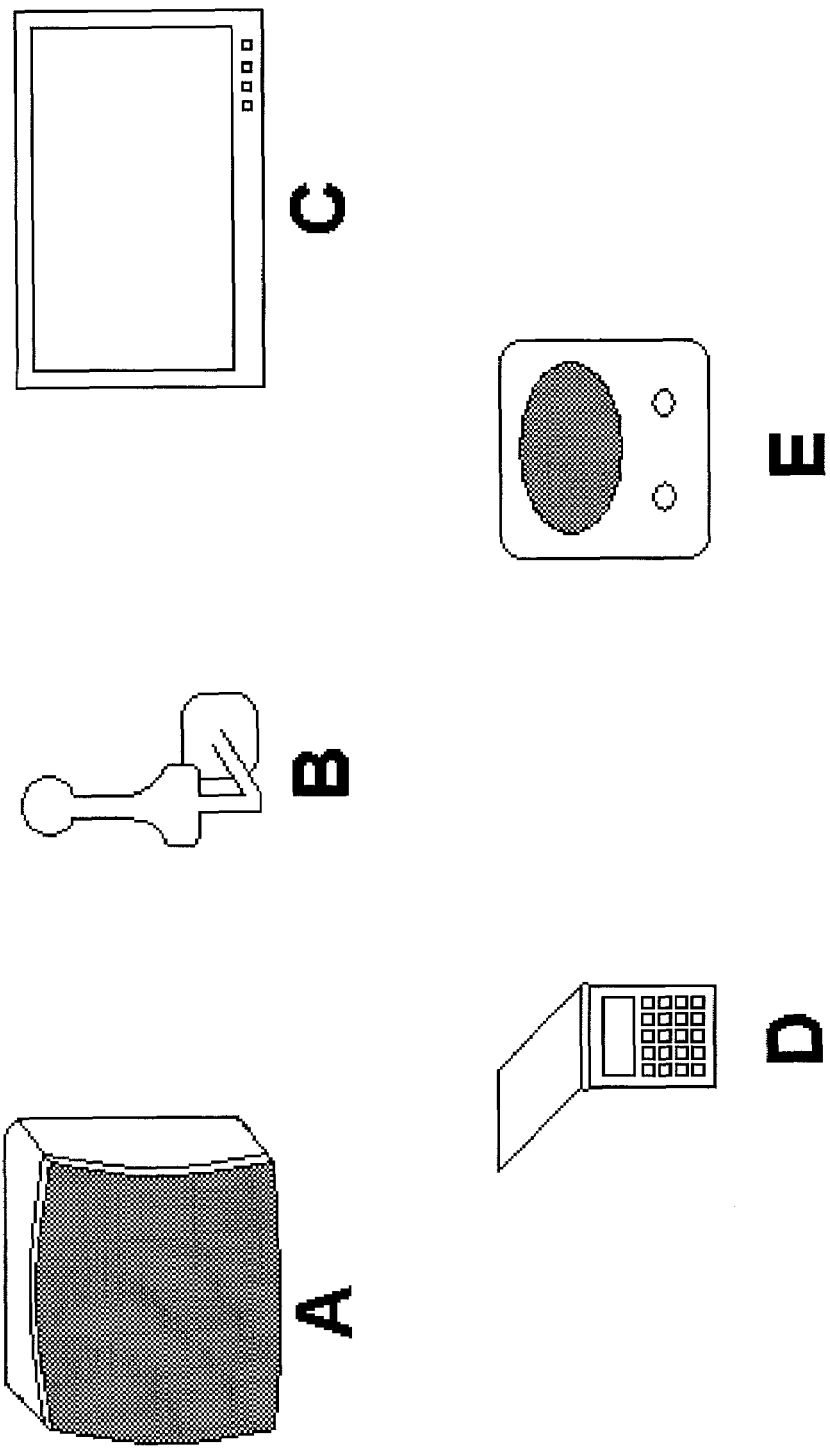
FIGS. 3A-E are front perspective views of various mounts, with the covers removed to show a speaker, a light, a display, a control panel, and a generic other device, respectively.

FIG. 2 is a rear perspective view of the mount and base of FIG. 1, coupled together. Mount 200 includes a cover 202, electrical device 204, feet 206, and mount through holes 208. Base 210 has outer piece 220 with base through holes 222, and inner piece 230 with electrical connectors 232 and screws 234.

Mount 200 has a cover 202 which can be removed for cleaning or replaced for functional or aesthetic reasons. Cover 202 is preferably attached to electrical device 204 without the use of hand tools, so as to aid in a quick and easy replacement.

Mount 200 also has feet 206 to cushion mount 200 when it abuts a surface. Feet 206 are made of an elastic plastic, but can be of any suitable material. Mount through holes 208 provide access to screws that couple the mounting surface 124 to the box 122.

Mount 200 is attached to base 210 via a magnetic force (not shown). Mount 200 can be detached from base 210 by exerting a force greater than the magnetic force.

Outer piece 220 can be attached to an outlet box with through holes 222. Inner piece 230 can be attached to an outlet using electrical connectors 232. Electrical connectors 232 have holes (not shown) where wires can be threaded so as to create an electrical connection. Other suitable methods of connecting electrical connectors are contemplated, for example splice taps, clips, RF connectors, banana connectors, D-sub connectors, or even simple wire twists. Screws 234 hold inner piece 230 in place on a circumferential lip (not shown) extending inwardly from the outer piece 114.

FIGS. 3A-E are front perspective views of various mounts to show a speaker, a light, a display, a control panel, and a microphone transmitter, respectively.

It should be apparent to those skilled in the art that many more modifications besides those already described are possible without departing from the inventive concepts herein. The inventive subject matter, therefore, is not to be restricted except in the spirit of the appended claims. Moreover, in interpreting both the specification and the claims, all terms should be interpreted in the broadest possible manner consistent with the context. In particular, the terms "comprises" and "comprising" should be interpreted as referring to elements, components, or steps in a non-exclusive manner, indicating that the referenced elements, components, or steps may be present, or utilized, or combined with other elements, components, or steps that are not expressly referenced. Where the specification claims refers to at least one of something selected from the group consisting of A, B, C . . . and N, the text should be interpreted as requiring only one element from the group, not A plus N, or B plus N, etc.

What is claimed is:

1. A mounting system connectable to an outlet box, comprising:
    a base fixable to the outlet box, and having a first electrical connector; and
    a mount magnetically coupled to the base, and having a second electrical connector that mates with the first electrical connector as the mount is mounted upon the base, wherein at least one of the base and the mount comprises both inner and outer portions that are rotatable relative to one another and wherein the base supports the weight of the mount.

2. The system of claim 1, wherein the base includes a plurality of through holes through which screws can be inserted to fix the base to the outlet box.

3. The system of claim 1, wherein the first and second electrical connectors are female and male, respectively.

4. The system of claim 1, wherein at least one of the electrical connectors includes a banana plug.

5. The system of claim 1, further comprising first and second magnets both coupled to at least one of the base and the mount, wherein the first and second magnets operate to magnetically couple the mount to the base.

6. The system of claim 5, further comprising a plurality of magnet seats, at least one of which does not contain a magnet.

7. The system of claim 1, wherein the base comprises inner and outer portions that are rotatable relative to one another, and wherein the inner portion includes the first connector.

8. The system of claim 1, wherein the base has a substantially planar surface, at least some portion of which includes a magnetically attractable material.

9. The system of claim 8, wherein the substantially planar surface has a surface area of at least 25 cm$^2$.

10. The system of claim 1, wherein the mount comprises a speaker.

11. The system of claim 1, wherein the mount comprises a light.

12. The system of claim 1, wherein the mount comprises a user interface to an electrical device.

13. The system of claim 1, wherein the mount comprises a user interface to a semiconductor display.

* * * * *